United States Patent
Su et al.

(10) Patent No.: US 8,987,033 B2
(45) Date of Patent: Mar. 24, 2015

(54) METHOD FOR FORMING CMOS IMAGE SENSORS

(75) Inventors: Ching-Chung Su, Yongkang (TW);
Shih-Chang Liu, Alian Township (TW);
Shih Pei Chou, Tainan (TW);
Chia-Shiung Tsai, Hsin-Chu (TW);
Chun-Tsung Kuo, Tainan (TW); Wen-I Hsu, Tainan (TW); Yi-Shin Chu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 72 days.

(21) Appl. No.: 13/196,560

(22) Filed: Aug. 2, 2011

(65) Prior Publication Data
US 2013/0034929 A1 Feb. 7, 2013

(51) Int. Cl.
*H01L 21/00* (2006.01)
*H01L 27/146* (2006.01)

(52) U.S. Cl.
CPC .................................. *H01L 27/1463* (2013.01)
USPC .................................. 438/57; 438/61; 438/73

(58) Field of Classification Search
CPC ................ H01L 31/145; H01L 31/153; H01L 21/76237; H01L 21/76218; H01L 31/167; H01L 31/173; H01L 27/14643; H01L 27/1463; H01L 27/146; H01L 27/14609
USPC ......... 438/57, 73, 61; 257/E27.133, E31.001, 257/E31.037, E31.075
See application file for complete search history.

(56) References Cited

U.S. PATENT DOCUMENTS

| | | | | |
|---|---|---|---|---|
| 5,073,512 A | * | 12/1991 | Yoshino | 438/291 |
| 5,482,889 A | * | 1/1996 | Yokoyama | 438/450 |
| 6,069,057 A | * | 5/2000 | Wu | 438/424 |
| 6,177,333 B1 | * | 1/2001 | Rhodes | 438/433 |
| 2003/0228731 A1 | * | 12/2003 | Hayashi | 438/224 |
| 2005/0139877 A1 | * | 6/2005 | Rhodes et al. | 257/292 |
| 2012/0052652 A1 | * | 3/2012 | Fu et al. | 438/423 |

* cited by examiner

*Primary Examiner* — Khiem D Nguyen
(74) *Attorney, Agent, or Firm* — Slater and Matsil, L.L.P.

(57) ABSTRACT

A method includes forming a blocking layer over a substrate, and etching the blocking layer to form a trench in the blocking layer. A dielectric layer is formed, wherein the dielectric layer comprises a first portion over the blocking layer, and a second portion in the trench. After the step of forming the dielectric layer, an implantation is performed to implant an impurity into the substrate to form a deep well region. After the implantation, the dielectric layer and the blocking layer are removed.

20 Claims, 4 Drawing Sheets

METHOD FOR FORMING CMOS IMAGE SENSORS

BACKGROUND

Complementary metal-oxide-semiconductor (CMOS) image sensors are widely used in the image-related products such as cameras and video recorders. CMOS image sensors are able to capture photons, and generate electrical signals from the received photons. To ensure the sensitivity of the CMOS image sensors, the leakage currents of the CMOS image sensors need to be well controlled. One of the methods of controlling the leakage currents is to define electrical insulations between the image sensors. For example, deep p-well regions are formed to have a grid pattern to insulate the image sensors that are formed in the grids.

The deep p-well regions are formed by implanting a p-type impurity into deep regions of a semiconductor substrate. Accordingly, the energy for the implantation is high. This requires that the mask used for the implantation to be thick. Conventionally, a thick oxide layer is typically formed over the semiconductor substrate, and then etched to form trenches that have a grid pattern, wherein the p-type impurity is implanted to the underlying semiconductor substrate through the trenches in the thick oxide layer.

The deep p-well regions need to be narrow, so that the chip area occupied by the insulation structure is as small as possible, and the respective image sensor wafer has a high fill factor. This requires that the trenches in the thick oxide layer to be narrow, and that the sidewalls of the trenches to be vertical. This requirement can be satisfied when the critical dimension of the trenches is greater than about 0.28 μm. When the critical dimension of the trenches is reduced to small than about 0.18 μm, however, the profiles of the trenches were no longer satisfactory. This is partially due to the limitation of the wavelength of deep UV light that is used for the lithography process, which is not suitable for exposing thick photo resist having such a small critical dimension. In addition, when the critical dimension of the trenches is too small, the limitation also incurs in the etching of the thick oxide layer, wherein there may be some oxide residue left at the bottom of the trenches with small critical dimension. It is difficult to etch the thick oxide layer to form high aspect ratio trenches having vertical sidewalls.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of forming narrow deep well regions is provided in accordance with various embodiments. The intermediate stages of forming the deep well regions are illustrated. The variations of the embodiments are discussed. Throughout the various views and illustrative embodiments, like reference numbers are used to designate like elements.

Figure 1:
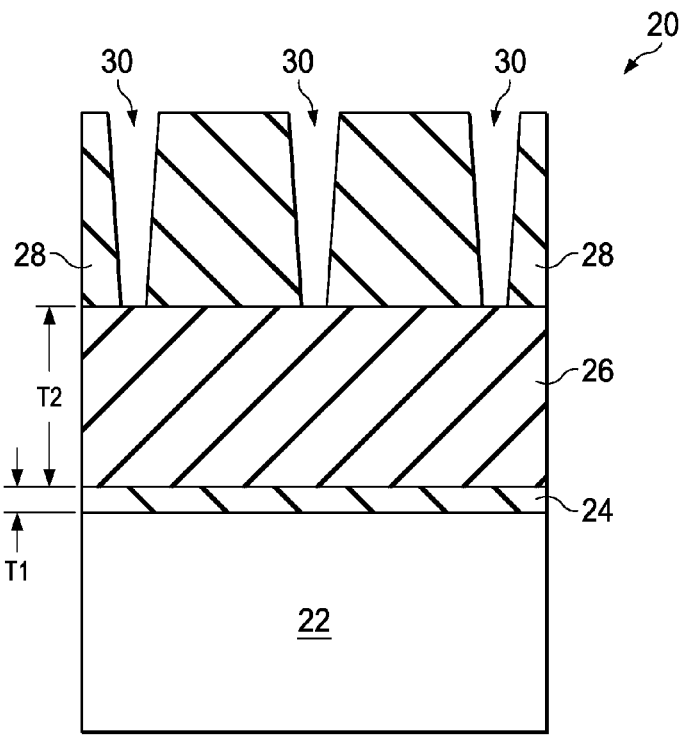
FIGS. 1 through 6 are cross-sectional views of intermediate stages in the manufacturing of a deep well region in a substrate in accordance with various embodiments.

FIG. 1 illustrates a cross-sectional view of a portion of semiconductor wafer 20, which includes semiconductor substrate 22. In an embodiment, semiconductor substrate 22 is a crystalline silicon or epitaxy silicon substrate, although it may also be formed of other semiconductor materials such as silicon germanium, silicon carbon, or the like. Silicon substrate 22 may be lightly doped with a p-type impurity such as boron, indium, or the like.

Mask 24 is formed over semiconductor substrate 22. Mask 24 may be formed of silicon nitride (SiN), for example. Mask 24 may be a thin layer to allow the p-type impurity that is implanted in a subsequent step to penetrate through and implanted into semiconductor substrate 22. In an embodiment, thickness T1 of mask 24 is between about 800 Å and about 1,600 Å. Blocking layer 26 is formed over mask 24, in an exemplary embodiment, blocking layer 26 is formed of silicon oxide (SiO2), or the like. Blocking layer 26 may be thick enough to block the p-type impurity that is implanted in the subsequent step from penetrating through and reaching semiconductor substrate 22. In an embodiment, thickness T2 of blocking layer 26 is between about 22 KÅ and about 30 KÅ, although different thicknesses may be used to suit to the desirable depths of the p-type impurity and the energy used for the implantation. Photo resist 28 is formed over blocking layer 26, and is then patterned to form trenches 30. In an embodiment, trenches 30 form a grid that has the same pattern as well regions 40/42 as in FIG. 7.

Figure 2:
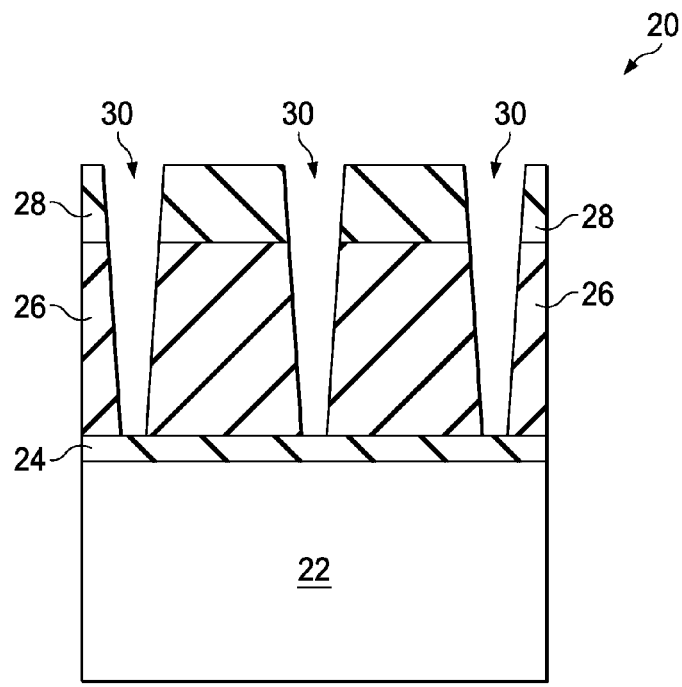
Figure 3:
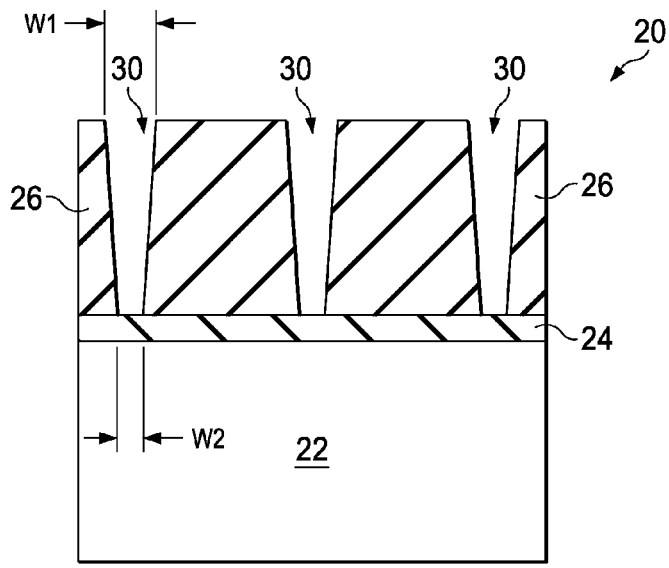

Referring to FIG. 2, photo resist 28 is used as a mask to etch the underlying blocking layer 26, so that trenches 30 extend into blocking layer 26. The etching process may be stopped at the top surface of mask 24, which is used as an etch stop layer. Next, in FIG. 3, photo resist 28 is removed, and blocking layer 26 is exposed. Trenches 30 in the resulting blocking layer 26 have top width W1 and bottom width W2. In an embodiment, top width W1 is between about 130 nm and about 300 nm, while bottom width W2 is between about 80 nm and about 250 nm. Width W1 and W2 may be substantially equal to each other, for example, with a difference smaller than about 50 nm. Trenches 30 may have an aspect ratio between about 8 and about 20, for example. It is realized, however, that the dimensions and values recited throughout the description are merely examples, and may be changed to different values.

Figure 4:
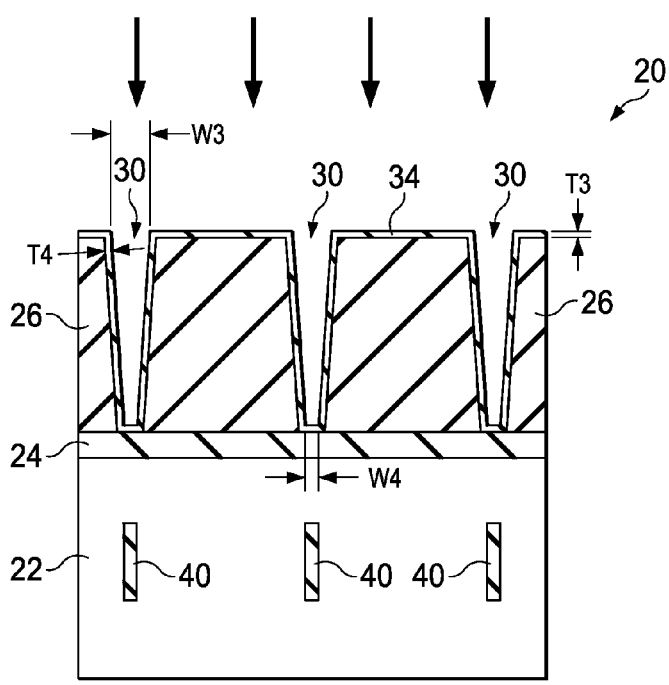

Referring to FIG. 4, layer 34 is formed. In an embodiment, layer 34 is formed of a same material as the material of blocking layer 26. For example, layer 34 may be formed of a dielectric material such as silicon oxide, and hence layer 34 is alternative referred to dielectric layer 34, although it may also be formed of other materials. The horizontal portions of dielectric layer 34 that are over blocking layer 26 has horizontal thickness T3, and the vertical portions of dielectric layer 34 that are in trenches 30 has vertical thickness T4. Dielectric layer 34 may be substantially conformal, wherein a ratio of thickness difference |T3−T4| to either of thicknesses T3 and T4 (which ratio may be expressed as |T3−T4|/T3 or |T3−T4|/T4) may be smaller than about 20 percent, or smaller than about 10 percent, for example. The thicknesses of dielectric layer 34 (thicknesses T3 and T4) may be between about 10 nm and about 30 nm. Thickness T3 is also such determined that bottom width W4 of the remaining trenches 30 after the formation of dielectric layer 34 is still greater than 0 nm. In an embodiment, bottom width W4 is between about 80 nm and about 130 nm. With dielectric layer 34 being conformal, the difference between top width W3 and bottom width W4 may be substantially equal to the difference between top width W1 and bottom width W2 (FIG. 3), and hence if trenches 30 in FIG. 3 have vertical sidewalls, the sidewalls of trenches 30 (after the formation of dielectric layer 34) will remain to be vertical. Accordingly, by forming dielectric layer 34, widths W1 and W2 of trenches 30 (FIG. 3) may be relatively large to reduce the process difficulty, while the requirement to have a small difference between widths W3 and W4 may be achieved by adjusting the thickness (T3 and T4) of dielectric layer 34.

In an embodiment, dielectric layer 34 comprises a high-temperature oxide (HTO) formed in a furnace, which may be formed using precursors comprising dichlorosilane (DCS) and $N_2O$. In an embodiment, the flow rate of DCS may be between about 50 sccm and about 300 sccm, and the flow rate of $N_2O$ may be between about 50 sccm and about 300 sccm. The temperature of wafer 20 during the formation of dielectric layer 34 may be between about 600° C. and 850° C. Under these exemplary process conditions, the deposition rate of dielectric layer 34 may be between about 2 Å/minute and about 4 Å/minute, for example.

In alternative embodiments, dielectric layer 34 comprises a low deposition-rate resistor protection oxide (LRPO) formed using, for example, plasma enhanced chemical vapor deposition (PECVD), and the like. Dielectric layer 34 may be formed using precursors comprising silane ($SiH_4$) and $N_2O$, and helium may be used as a carrier gas. In an embodiment, the flow rate of silane may be between about 20 sccm and about 60 sccm, the flow rate of $N_2O$ may be between about 2,000 sccm and about 6,000 sccm, and the flow rate of helium may be between about 8,000 sccm and about 12,000 sccm. The temperature of wafer 20 may be between about 350° C. and about 450° C. Under these exemplary process conditions, the deposition rate of dielectric layer 34 may be between about 10 Å/minute and about 14 Å/minute.

FIG. 4 also illustrate the implantation of a p-type impurity, which is implanted into semiconductor substrate 22 to form deep p-well regions 40. The p-type impurity may be boron, indium, or combinations thereof. In an embodiment, the p-type impurity comprises boron, and is implanted using an energy between about 1.0 MeV and about 2.0 MeV. Accordingly, deep p-well regions 40 are buried in semiconductor substrate 22, and are spaced apart from the top surface of semiconductor substrate 22. The p-type impurity enters into trenches 30 and penetrates through mask 24 and the portions of dielectric layer 34 at the bottoms of trenches 30. Blocking layer 26 blocks the implanted p-type impurity from reaching semiconductor substrate 22, so that the p-type impurity is implanted into semiconductor substrate 22 where there are trenches 30. After the implantation of the p-type impurity, dielectric layer 34, blocking layer 26, and mask 24 are removed.

Figure 5:
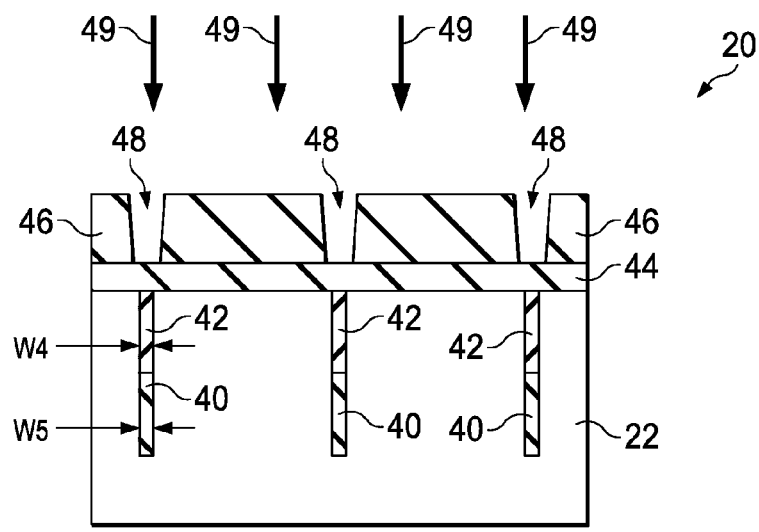

Referring to FIG. 5, shallow p-well regions 42 are formed. Although FIGS. 4 and 5 illustrate that shallow p-well regions 42 are formed after the formation of deep p-well regions 40, in alternative embodiments, shallow p-well regions 42 may be formed before the formation of deep p-well regions 40. Shallow p-well regions 42 may have a same pattern (FIG. 7) as deep p-well regions 40, and shallow p-well regions 42 may be directly overlying, and vertically aligned to, deep p-well regions 40. Furthermore, width W4 of shallow p-well regions 42 may be substantially equal to width W5 of the respective underlying deep p-well regions 40. Shallow p-well regions 42 may extend from the top surface of semiconductor substrate 22 to the top ends of deep p-well regions 40, so that shallow p-well regions 42 and deep p-well regions 40 in combination form well regions that extend from the top surface of semiconductor substrate 22 to a level deep into semiconductor substrate 22. Accordingly, shallow p-well regions 42 and deep p-well regions 40 form deep electrical isolation regions.

In an embodiment, the formation of shallow p-well regions 42 comprises coating with thin photo resist 46 to form trenches 48, and implanting a p-type impurity. Thin photo resist 46 acts as the blocking layer of the p-type impurity. Arrows 49 symbolize the implantation of the p-type impurity. Since shallow p-well regions 42 are shallower than deep p-well regions 40, the energy for forming shallow p-well regions 42 is lower than the energy for forming p-well regions 40, and the thickness of photo resist 46 is also smaller than the thickness of blocking layer 26. Accordingly, there is no need to form a conformal layer (similar to dielectric layer 34) after the formation of trenches 48 and before the implantation 49 of the p-type impurity.

Figure 6:
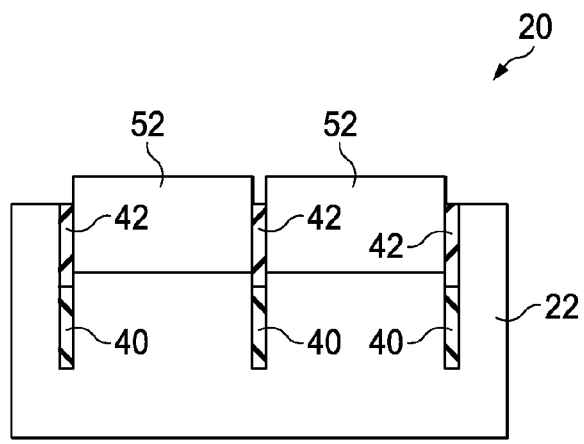
Figure 7:
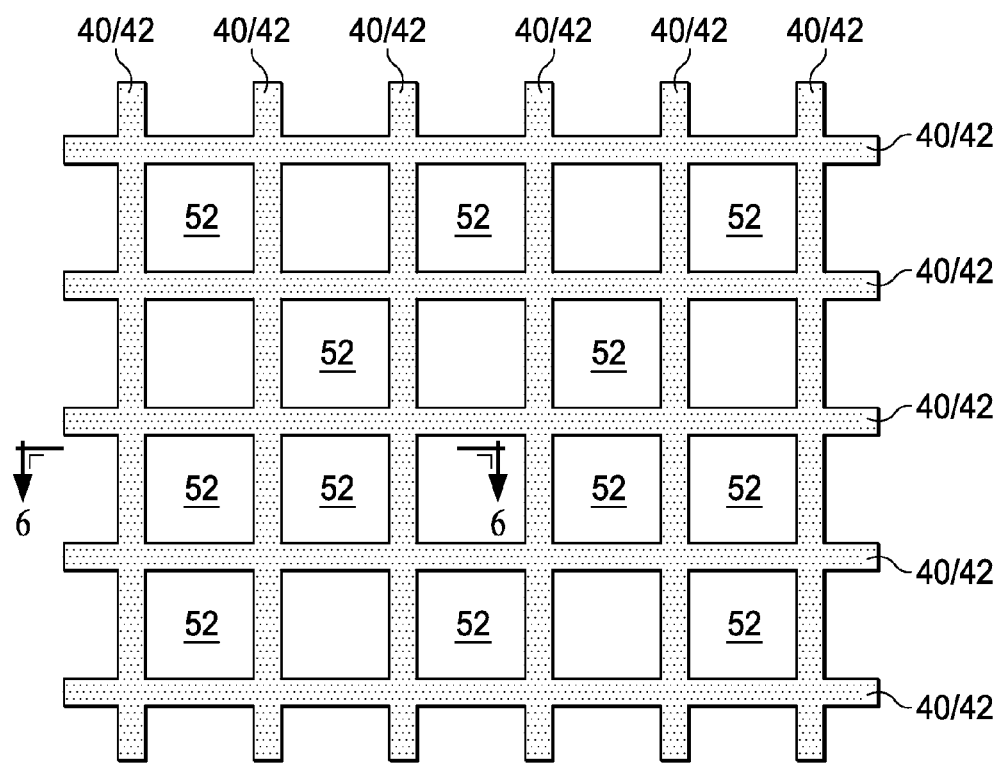
FIG. 7 illustrates a top view of the structure shown in FIG. 6.

FIG. 6 schematically illustrates the formation of complementary metal-oxide-semiconductor (CMOS) image sensors 52 at the top surface of semiconductor substrate 22. Image sensors 52 may be photo diodes or photo-sensitive transistors that are configured to convert the light received by image sensors 52 to electrical signals. Each of the grid formed of shallow p-well regions 42 and deep p-well regions 40 may comprise one of image sensors 52 formed therein, wherein shallow p-well regions 42 and deep p-well regions 40 form the electrical isolation of image sensors 52, so that the leakage currents of image sensors 52 are reduced. FIG. 7 illustrates a top view of image sensors 52 that are separated by deep p-well regions 40 and possible shallow p-well regions 42, wherein the cross-sectional view shown in FIG. 6 may be obtained from the plane crossing line 6-6 in FIG. 7.

In the above-discussed embodiments, although deep p-well regions are formed in the illustrated embodiments. The teaching of the embodiments may be applied to the formation of deep n-well regions. For example, in the step shown in FIG. 4, instead of implanting the p-type impurity, an n-type impurity such as phosphorous, arsenic, or combinations thereof, may be implanted, and hence deep well regions 40 are deep n-well regions.

In the embodiments, it is observed that with the formation of dielectric layer 34, the aspect ratio of trenches 30 is significantly increased (FIGS. 3 and 4) without incurring process difficulty. The formation of dielectric layer 34 makes it possible for increasing the aspect ratio of deep trenches in blocking layer 26 beyond the lithography limits and the etching limits. Experiments performed on silicon wafers indicated that if dielectric layer 34 is not formed, top width W1 (FIG. 3) of trenches 30 may be as small as about 213 nm, wherein the difference between top width W1 and bottom width W2 was about 57 nm. If top width W1 (FIG. 3) is reduced to about 172 nm (without forming dielectric layer 34), the difference between top width W1 and bottom width W2 undesirably increased to about 89 nm, indicating that the sidewalls of trenches 30 are not as vertical as desired. If the embodiments are performed and dielectric layer 34 is formed, the top width W1 of trenches 30 may be narrowed to about 129 nm, while the difference between top width W3 (FIG. 4) and bottom width W4 is still as low as about 49 nm. Therefore, using the embodiments, very narrow trenches 30 that have vertical sidewalls may be formed. Accordingly, very narrow deep p-well regions 40 may be formed, and the fill factor of the chip is increased.

In accordance with some embodiments, a method includes forming a blocking layer over a substrate, and etching the blocking layer to form a trench in the blocking layer. A dielectric layer is formed, wherein the dielectric layer comprises a first portion over the blocking layer, and a second portion in the trench. After the step of forming the dielectric layer, an implantation is performed to implant an impurity into the substrate to form a deep well region. After the implantation, the dielectric layer and the blocking layer are removed.

In accordance with other embodiments, a method includes forming a blocking layer over a substrate, and etching the blocking layer to form a trench in the blocking layer, wherein the trench has a first top width and a first bottom width. A substantially conformal layer is formed to reduce the first top width of the trench to a second top width, and reduce the first bottom width of the trench to a second bottom width. After the step of forming the substantially conformal layer, an implantation is performed to implant an impurity into the substrate, wherein first portions of the impurity implanted into the trench are implanted into the substrate to form a deep well region, and wherein second portions of the impurity implanted into un-etched portions of the blocking layer are blocked from reaching the substrate.

In accordance with yet other embodiments, a method includes forming a nitride layer over a semiconductor substrate, and forming a first oxide layer over the nitride layer. The first oxide layer is etched to form a trench in the first oxide layer. A second oxide layer is formed over the first oxide layer, wherein the second oxide layer includes sidewall portions on sidewalls of the trench and a bottom portion at a bottom of the trench. After the step of forming the second oxide layer, an implantation is performed to implant a p-type impurity into the semiconductor substrate to form a deep p-well region vertically aligned to the trench, wherein un-etched portions of the first oxide layer block the p-type impurity from reaching the semiconductor substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a mask layer over a substrate;
   forming a blocking layer over the mask layer;
   etching the blocking layer until reaching the mask layer, the etching discontinued at the mask layer, to form a trench in the blocking layer;
   forming a dielectric layer, wherein the dielectric layer comprises a first portion over a top surface of the blocking layer, and a second portion in the trench;
   after the step of forming the dielectric layer, performing an implantation to implant an impurity into the substrate to form a deep well region, the deep well region spaced apart from a top surface of the substrate; and
   after the implantation, removing the first and second portions of the dielectric layer and the blocking layer.

2. The method of claim 1, wherein the dielectric layer comprises a bottom portion at a bottom of the trench, and wherein during the step of implantation, the impurity penetrates through the bottom portion to form the deep well region.

3. The method of claim 1 further comprising forming a shallow well region over and vertically aligned to the deep well region, and wherein the shallow well region and the deep well region are of a same conductivity type.

4. The method of claim 1, wherein the trench forms a grid pattern, and wherein the method further comprises forming an image sensor in a grid of the grid pattern.

5. The method of claim 1, wherein the dielectric layer is a substantially conformal layer, and wherein a first thickness of a first portion of the dielectric layer on a sidewall of the trench is substantially equal to a second thickness of a second portion of the dielectric layer over the blocking layer.

6. The method of claim 1, wherein the dielectric layer and the blocking layer are formed of a same material.

7. The method of claim 1, wherein during the implantation, the impurity penetrates through the mask.

8. A method comprising:
   forming a mask layer over a substrate;
   forming a blocking layer over the mask layer;
   etching the blocking layer until reaching the mask layer, the etching discontinued at the mask layer, to form a trench in the blocking layer, wherein the trench has a first top width and a first bottom width;
   forming a substantially conformal layer over a top surface of the blocking layer and in the trench to reduce the first top width of the trench to a second top width, and reduce the first bottom width of the trench to a second bottom width; and
   after the step of forming the substantially conformal layer, performing an implantation through the conformal layer over the top surface of the blocking layer and in the trench to implant an impurity into the substrate, wherein first portions of the impurity implanted into the trench are implanted into the substrate to form a deep well region, the deep well region spaced apart from a top surface of the substrate, and wherein second portions of the impurity implanted into un-etched portions of the blocking layer are blocked from reaching the substrate.

9. The method of claim 8 further comprising, after the implantation, removing the substantially conformal layer and the blocking layer.

10. The method of claim 8, wherein the substantially conformal layer comprises a bottom portion at a bottom of the trench, and wherein during the implantation, the impurity penetrates through the bottom portion of the substantially conformal layer to form the deep well region.

11. The method of claim 8, wherein the trench forms a grid pattern, and wherein the method further comprises:
    forming shallow well region over, and vertically aligned to, the deep well region; and
    forming an image sensor in a grid of the grid pattern.

12. The method of claim 8, wherein the substantially conformal layer and the blocking layer are formed of a same material.

13. The method of claim 11, wherein the substantially conformal layer and the blocking layer are formed of a same material.

14. The method of claim 8, wherein the impurity is of p-type.

15. A method of forming a complementary metal-oxide-semiconductor (CMOS) sensor chip, the method comprising:

forming a nitride layer over a semiconductor substrate;

forming a first oxide layer over the nitride layer;

etching the first oxide layer until reaching the nitride layer, the etching discontinued at the nitride layer, to form a trench in the first oxide layer;

forming a second oxide layer over the first oxide layer, wherein the second oxide layer comprises sidewall portions on sidewalls of the trench, and a bottom portion at a bottom of the trench;

after the step of forming the second oxide layer, performing an implantation to implant a p-type impurity into the semiconductor substrate to form a deep p-well region vertically aligned to the trench, the deep p-well region spaced apart from a top surface of the substrate, and wherein un-etched portions of the first oxide layer block the p-type impurity from reaching the semiconductor substrate; and forming CMOS image sensors adjacent to a surface of the semiconductor substrate, wherein the CMOS image sensors are isolated from each other by the deep p-well region.

16. The method of claim 15 further comprising, after the implantation, removing the first and the second oxide layers and the nitride layer.

17. The method of claim 15, wherein during the implantation, the p-type impurity penetrates through the bottom portion of the second oxide layer and the nitride layer to form the deep p-well region.

18. The method of claim 15, wherein the deep p-well region forms a grid pattern, and wherein the method further comprises forming an image sensor in a grid of the grid pattern.

19. The method of claim 15, wherein the second oxide layer is a high temperature oxide, and wherein the step of forming the second oxide layer is performed using a furnace.

20. The method of claim 15, wherein the step of forming the second oxide layer is performed using plasma enhanced chemical vapor deposition.

* * * * *